US008633055B2

(12) United States Patent
Adkisson et al.

(10) Patent No.: US 8,633,055 B2
(45) Date of Patent: Jan. 21, 2014

(54) GRAPHENE FIELD EFFECT TRANSISTOR

(75) Inventors: James W. Adkisson, Jericho, VT (US); Thomas J. Dunbar, Burlington, VT (US); Jeffrey P. Gambino, Westford, VT (US); Molly J. Leitch, Rocky River, OH (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/324,246

(22) Filed: Dec. 13, 2011

(65) Prior Publication Data

US 2013/0146846 A1 Jun. 13, 2013

(51) Int. Cl.

*H01L 51/40* (2006.01)
*H01L 21/8232* (2006.01)
*H01L 21/336* (2006.01)
*H01L 21/00* (2006.01)

(52) U.S. Cl.

USPC ............ 438/99; 438/142; 438/197; 438/294; 257/E21.001

(58) Field of Classification Search

None
See application file for complete search history.

(56) References Cited

U.S. PATENT DOCUMENTS

| | | | | |
|---|---|---|---|---|
| 4,760,036 | A | 7/1988 | Shubert | |
| 5,231,037 | A | 7/1993 | Yuan et al. | |
| 5,723,370 | A | 3/1998 | Ning et al. | |
| 5,793,082 | A | 8/1998 | Bryant | |
| 6,223,813 | B1 | 5/2001 | Chrysler et al. | |
| 7,732,859 | B2 | 6/2010 | Anderson et al. | |
| 7,851,309 | B2 | 12/2010 | Leslie | |
| 7,960,713 | B2 * | 6/2011 | Hunt et al. | 257/4 |
| 8,358,008 | B2 * | 1/2013 | Wada et al. | 257/750 |
| 2005/0035390 | A1 | 2/2005 | Beroz | |
| 2005/0212014 | A1 | 9/2005 | Horibe et al. | |
| 2006/0202239 | A1 | 9/2006 | Holmes et al. | |
| 2007/0053168 | A1 | 3/2007 | Sayir et al. | |
| 2007/0059891 | A1 | 3/2007 | Furukawa et al. | |
| 2008/0170982 | A1 | 7/2008 | Zhang et al. | |
| 2009/0020764 | A1 | 1/2009 | Anderson et al. | |
| 2010/0003462 | A1 | 1/2010 | Kamins et al. | |
| 2010/0006823 | A1 | 1/2010 | Anderson et al. | |
| 2010/0200840 | A1 | 8/2010 | Anderson et al. | |
| 2010/0214012 | A1 | 8/2010 | Raza | |
| 2010/0224851 | A1 | 9/2010 | Colombo et al. | |
| 2010/0258787 | A1 | 10/2010 | Chae et al. | |
| 2011/0042649 | A1 | 2/2011 | Duvall et al. | |
| 2011/0057251 | A1 * | 3/2011 | Higashi | 257/324 |
| 2011/0059599 | A1 * | 3/2011 | Ward et al. | 438/507 |
| 2011/0114919 | A1 | 5/2011 | Jenkins et al. | |

(Continued)

FOREIGN PATENT DOCUMENTS

| | | |
|---|---|---|
| JP | 2002110977 | 4/2002 |
| WO | 2012017533 | 2/2012 |

OTHER PUBLICATIONS

Lin, Y. et al., "Progress and Future of Carbon-Based Electronics", IEEE, 2008, 2 pages.

(Continued)

*Primary Examiner* — Alexander Ghyka
*Assistant Examiner* — Evren Seven
(74) *Attorney, Agent, or Firm* — Michael LeStrange; Roberts Mlotkowski Safran & Cole, P.C.

(57) ABSTRACT

Manufacturing a semiconductor structure including: forming a seed material on a sidewall of a mandrel; forming a graphene field effect transistor (FET) on the seed material; and removing the seed material.

22 Claims, 7 Drawing Sheets

80 80 20a 20b 30 85 30 85

(56) References Cited

U.S. PATENT DOCUMENTS

| | | | | |
|---|---|---|---|---|
| 2011/0220865 | A1* | 9/2011 | Miyata et al. | 257/12 |
| 2011/0253983 | A1 | 10/2011 | Chen et al. | |
| 2011/0284818 | A1 | 11/2011 | Avouris et al. | |
| 2012/0074387 | A1* | 3/2012 | King | 257/29 |
| 2012/0086132 | A1* | 4/2012 | Kim et al. | 257/774 |
| 2012/0138902 | A1* | 6/2012 | Hunt et al. | 257/29 |
| 2012/0205653 | A1* | 8/2012 | Nishikage et al. | 257/49 |
| 2012/0256167 | A1* | 10/2012 | Heo et al. | 257/27 |

OTHER PUBLICATIONS

Kedzierski, J. et al., "Graphene-on-Insulator Transistors Made Using C on Ni Chemical-Vapor Deposition", IEEE Electron Device Letters, vol. 30, No. 7, Jul. 2009, pp. 745-747.

Gomez De Arco, L. et al., "Synthesis, Transfer, and Devices of Single- and Few-Layer Graphene by Chemical Vapor Deposition", IEEE Transactions on Nanotechnology, vol. 8, No. 2, Mar. 2009, pp. 135-138.

Farmer, D. et al., "Behavior of a chemically doped graphene junction", Applied Physics Letters 94, American Institue of Physics, 2009, pp. 1-3.

Lin, Y. et al., "Dual-Gate Graphene FETs With fT of 50 GHz", IEEE Electron Device Letters, vol. 31, No. 1, Jan. 2010, pp. 68-70.

Jung, M. et al., "Polymer Material as a Gate Dielectric for Graphene Field-Effect-Transistor Applications", Japanese Journal of Applied Physics 50, The Japan Society of Applied Physics, 2011, pp. 1-5.

Avouris, P. et al., "Graphene-based fast electronics and optoelectronics", IEEE, 2010, pp. 1-4.

Liu, W. et al., "Chemical vapor deposition of large area few layer graphene on Si catalyzed with nickel films", Thin Solid Films, Elsevier, 2010, pp. 128-132.

"Microtechnology/Etching Processes", http://en.wikibooks/wiki/Microtechnology/Etching_Processes, Wikibooks, Aug. 10, 2011, pp. 1-15.

Reina, A. et al., "Large Area, Few-Layer Graphene Films on Arbitrary Substrates by Chemical Vapor Deposition", Nano Letters, American Chemical Society, 2009, vol. 9, No. 1, 7 pages.

ASM International, Graphene Grains Make Atom-Thick Patchwork 'Quilts', http://www.asminternational.org/portal/site/www/NewsItemPrint/?vgnextoid=711d81b9f1a9d210VgnVCM100000621e010aRCRD, Jan. 18, 2011,2 pages.

International Search Report for PCT Application No. PCT/US2012/063508, dated Jan. 31, 2013, 4 pages.

Written Opinion of the International Searching Authority for PCT Application No. PCT/US2012/063508, dated Jan. 31, 2013, 5 pages.

Final Office Action dated Jul. 10, 2013 in related U.S. Appl. No. 13/492,131; 8 Pages.

Notice of Allowance dated Oct. 25, 2013 in related U.S. Appl. No. 13/492,131; 10 pages.

* cited by examiner

GRAPHENE FIELD EFFECT TRANSISTOR

FIELD OF THE INVENTION

The invention relates to semiconductor structures and methods of manufacture and, more particularly, to a graphene field effect transistor (FET).

BACKGROUND

In the last few decades, the semiconductor industry has been able to maintain steady improvements of device performance by the scaling of silicon-based devices. However, it is believed this approach will soon meet both scientific and technical limits, and there have been tremendous efforts to seek alternative device technologies. One such alternative is the use of graphene in semiconductor structures.

Graphene is a layer of carbon atoms bonded in a honeycomb crystal lattice. Graphene has a high carrier mobility, as well as low noise, allowing it to be used as a substitute for silicon in the channel in a FET. Intrinsic graphene is a semimetal or zero-gap semiconductor, with an E-k relation that is linear at low energies near the six corners of the two-dimensional hexagonal Brillouin zone, leading to zero effective mass for electrons and holes. Graphene has high electron mobility at room temperature, with reported values of 15,000 $cm^2V^{-1}s^{-1}$. Moreover, graphene resistivity is very low, e.g., less than the resistivity of silver, which is the lowest resistivity substance currently known at room temperature. Measurements have shown that graphene has a breaking strength 200 times greater than steel, with a tensile strength of 130 GPa. Additionally, graphene has thermal properties comparable to diamond for basal plane thermal conductivity. As for optical properties, graphene can be saturated readily under strong excitation over the visible to near-infrared region, due to the universal optical absorption and zero band gap, which permits application in ultrafast photonics.

Accordingly, there exists a need in the art to overcome the deficiencies and limitations described hereinabove.

SUMMARY

In a first aspect of the invention, a method of manufacturing a semiconductor structure includes forming a seed material on a sidewall of a mandrel. The method also includes forming a graphene field effect transistor (FET) on the seed material. The method also includes removing the seed material.

In another aspect of the invention, a method of forming a semiconductor structure includes: forming a mandrel on a semiconductor substrate; forming a sacrificial seed material on first and second sidewalls of the mandrel; and forming a graphene layer on the sacrificial seed material on the first and second sidewalls of the mandrel. The method also includes: forming source electrodes and drain electrodes on the graphene layer; forming a gate dielectric on the source electrodes, the drain electrodes, and the graphene layer; and forming gate electrodes on the gate dielectric. The method also includes: forming an insulator material over the source electrodes, drain electrodes, and gate electrodes; forming a vent hole in the insulator material; and removing the sacrificial seed material through the vent hole.

In yet another aspect of the invention, a semiconductor structure includes a mandrel on a substrate, the mandrel having a sidewall arranged at an acute angle relative to an upper surface of the substrate. The structure also includes a graphene field effect transistor (FET) structured and arranged on the sidewall of a mandrel.

In yet another aspect of the invention, a semiconductor structure includes a graphene layer having a first portion arranged at a first angle relative to an upper surface of a substrate, a second portion arranged at a second angle relative to the upper surface of the substrate, and a third portion arranged between the first portion and the second portion, wherein the first angle is different than the second angle. The structure also includes a first graphene field effect transistor (FET) on the first portion, and a second graphene FET on the second portion.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of a graphene FET, which comprises the structures of the present invention. In still further embodiments, a method in a computer-aided design system is provided for generating a functional design model of the graphene FET. The method comprises generating a functional representation of the structural elements of the graphene FET.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to a graphene field effect transistor (FET). According to aspects of the invention, graphene that functions as a channel in a FET is grown on a sacrificial material that is arranged on sidewalls of a mandrel. In embodiments, source/drain electrodes, a gate dielectric, and a gate electrode are formed on the graphene, and the sacrificial material is subsequently removed. In this manner, a vertical graphene FET is formed at the wafer level without using transfer processes.

Graphene is currently being used in field effect transistors (FETs) and integrated circuits (ICs). However, single sheets of graphene are difficult to produce, and more difficult to form on an appropriate substrate. For example, graphene is typically utilized by growing the graphene on a first substrate and then transferring the graphene to a second substrate, e.g., referred to as exfoliation, transfer, etc. Such transferring processes involve numerous manufacturing steps and results in high cost and low yield.

Figure 1:
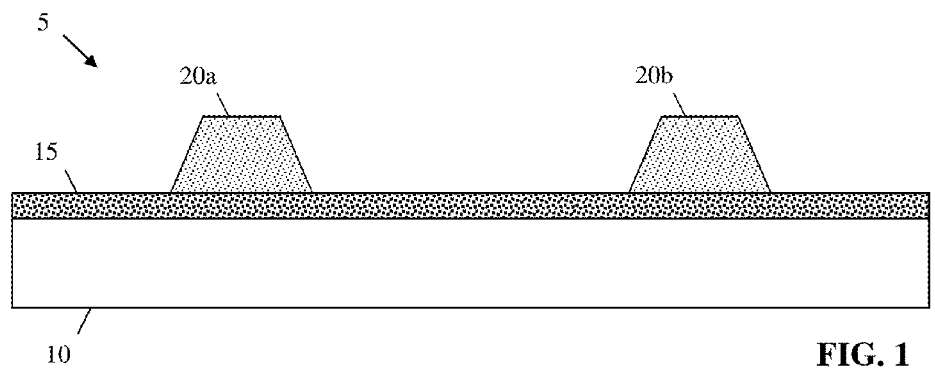
FIGS. 1-17 show processing steps and structures in accordance with aspects of the invention.

FIGS. 1-17 show processing steps and structures in accordance with aspects of the invention. In particular, FIG. 1 shows a cross section of a portion of a semiconductor structure 5 that has undergone CMOS processing. The semiconductor structure 5 may comprise a substrate 10. The substrate 10 may be composed of any suitable material or combination of materials, such as doped or undoped silicon, glass, etc. For example, the substrate may comprise a semiconductor-oninsulator (SOI), e.g., with a buried insulator layer, or a bulk material substrate, e.g., with appropriately doped regions typically referred to as wells.

In embodiments, an insulator layer 15 is formed on the substrate 10. The insulator layer 15 may comprise any suitable electrical insulator material, such as SiN, etc., and may be formed using conventional semiconductor processing techniques, such as chemical vapor deposition (CVD), etc.

Still referring to FIG. 1, at least one mandrel 20*a*, 20*b*, etc., is formed on the insulator layer 15. Although two mandrels 20*a* and 20*b* are shown in FIG. 1, it is understood that any number of mandrels may be used within the scope of the invention. Each mandrel 20*a* and 20*b* comprises an electrical insulator material having first and second sidewalls that are arranged at an angle (e.g., an acute and/or non-zero angle) relative to the upper surface of the substrate 10. The first and second sidewalls may be arranged at different angles relative to the upper surface of the substrate 10. For example, each mandrel 20*a* and 20*b* may have a substantially trapezoidal shape in cross section. In embodiments, the mandrels 20*a* and 20*b* comprise $SiO_2$, although any suitable insulator material can be used within the scope of the invention. The mandrels 20*a* and 20*b* may be formed using conventional semiconductor processing techniques, such as deposition, masking, and etching.

For example, any desired number of mandrels may be simultaneously formed by first forming a layer of mandrel material, e.g., a layer of $SiO_2$ formed using CVD, on the insulator layer 15. Then a photomask may be provided by forming a layer of photoresist material on the layer of mandrel material, exposing the photoresist material to a pattern of light, and developing the exposed photoresist material. An etching process, such as a reactive ion etch (RIE), may then be used to form patterns (e.g., openings) in the layer of mandrel material by removing portions of the layer of mandrel material that are not covered by the photomask. After etching, the photomask may be removed using a conventional ashing or stripping process. The un-etched portions of the layer of mandrel material that remain after the masking and etching form the mandrels 20*a* and 20*b*. The mandrels 20*a* and 20*b* may be provided with angled sidewalls, e.g., a substantially trapezoidal shape, by using a tapered resist profile, e.g., with a half-tone mask, or by intentionally eroding portions of the resist prior to or during the etching step.

Figure 2:
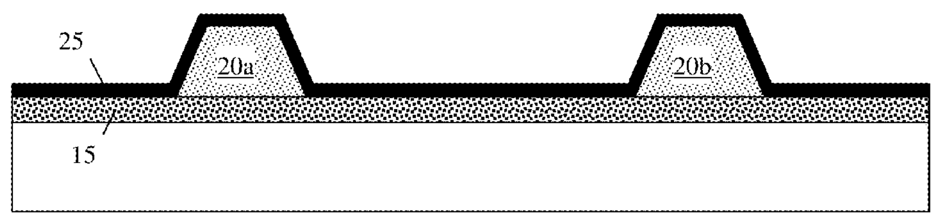

As shown in FIG. 2, a sacrificial seed material 25 is formed on the upper surfaces of the insulator layer 15 and mandrels 20*a* and 20*b*. According to aspects of the invention, the sacrificial seed material 25 is used as a seed material for forming graphene, as described in greater detail herein. In embodiments, the sacrificial seed material 25 comprises a layer of Ni (nickel) that is about 10 nm to about 500 nm thick and is formed using a sputtering process, although other suitable materials, thicknesses, and/or deposition processes may be used within the scope of the invention.

Figure 3:
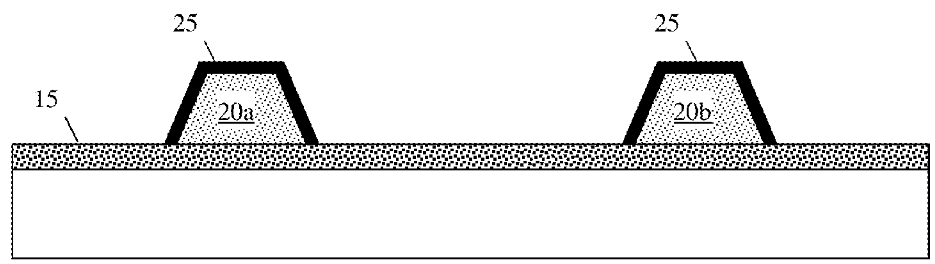

As shown in FIG. 3, the sacrificial seed material 25 is patterned such that the sacrificial seed material 25 does not extend continuously from one mandrel 20*a* to another mandrel 20*b*. The sacrificial seed material 25 may be patterned in any desired manner, such as using photolithographic masking and etching. In embodiments, the sacrificial seed material 25 remains on the mandrels 20*a* and 20*b* after patterning.

Figure 4:
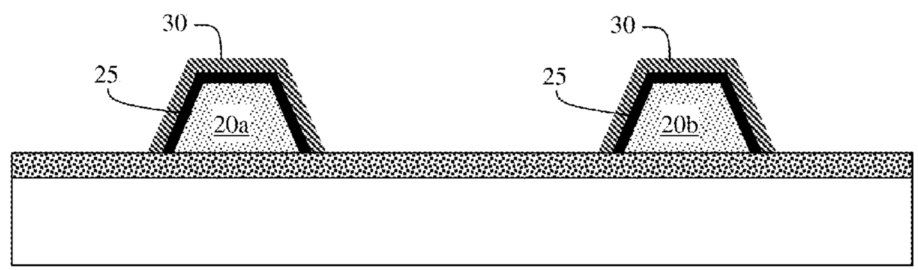

FIG. 4 shows the formation of graphene 30 on the sacrificial seed material 25 on the mandrels 20*a* and 20*b*. In embodiments, the sacrificial seed material 25 comprises Ni and the graphene 30 is grown with a CVD process. For example, a single layer of graphene may be formed on Ni using a CVD process with a flow of methane ($CH_4$), argon (Ar), and hydrogen ($H_2$) gases at temperatures from about 900° C. to about 1000° C. for growth times of about 50 s to about 120 s, and post-growth cooling with a flow of Ar and $H_2$ at a cooling rate in a range of about 7° C./min to about 25° C./min. It is to be understood, however, that any suitable method may be used to form the graphene 30 on the sacrificial seed material 25.

Since the sacrificial seed material 25 is formed on the angled sidewalls of the mandrels 20*a* and 20*b*, and the graphene 30 is formed on the sacrificial seed material 25, the graphene 30 is provided with a shape similar to the perimeter of the mandrels 20*a* and 20*b*. For example, as shown in FIG. 4, the graphene 30 on each respective mandrel 20*a* and 20*b* has a first portion arranged at a first angle relative to an upper surface of a substrate, a second portion arranged at a second angle relative to the upper surface of the substrate, and a third portion arranged between the first portion and the second portion, wherein the first angle is different than the second angle.

Figure 5:
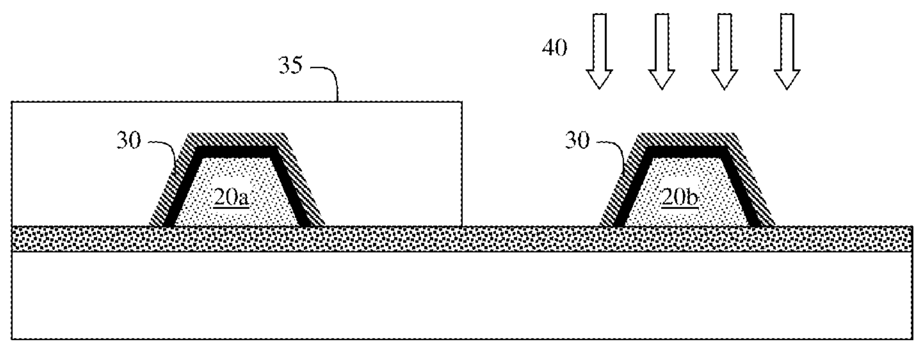
Figure 6:
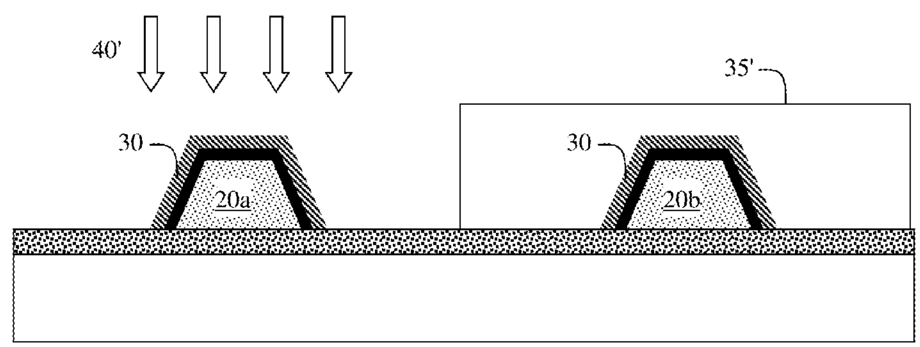

FIGS. 5 and 6 show optional doping of the graphene 30 on the respective mandrels 20*a* and 20*b*. For example, as shown in FIG. 5, a mask 35 may be formed over the first mandrel 20*a* and associated graphene 30, leaving the second mandrel 20*b* and its associated graphene 30 exposed. The mask 35 may comprise a photomask or hard mask formed using conventional semiconductor processing techniques, e.g., photolithography. After forming the mask 35, the graphene 30 on the second mandrel 20*b* may be doped with n-type or p-type dopant using any suitable doping technique, represented by arrows 40. For example, for n-type doping, the graphene 30 on the second mandrel 20*b* may be chemically doped by exposure to a solution containing polyethylene imine (PEI) for a sufficient amount of time to permit PEI molecules to adsorb into the graphene 30. Alternatively, for p-type doping, the graphene 30 on the second mandrel 20*b* may be chemically doped by exposure to diazonium salts that bind to the graphene surface. The mask 35 is removed after doping the graphene 30 on the second mandrel 20*b*.

FIG. 6 shows forming a second mask 35' over the second mandrel 20*b* and its associated graphene 30, leaving the first mandrel 20*a* and its associated graphene 30 exposed. A second doping depicted by arrows 40' may be performed in a manner similar to that described above with respect to FIG. 5. The mask 35' is removed after the second doping. For example, FIG. 5 may represent an n-type doping of the graphene 30 on the second mandrel 20*b* and FIG. 6 may represent a p-type doping of the graphene 30 on the first mandrel 20*a*, or vice versa.

Figure 7:
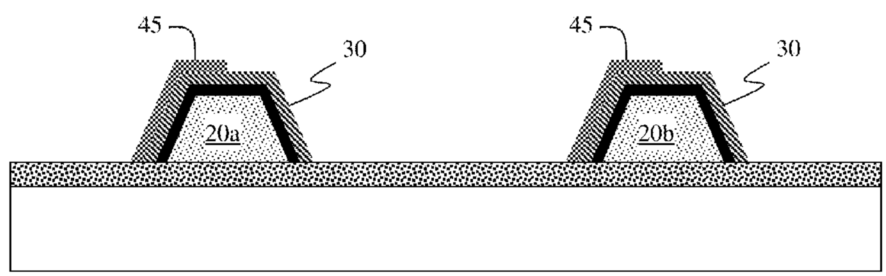

As show in FIG. 7, source/drain electrodes 45 are formed on the graphene 30 on the mandrels 20*a* and 20*b*. The source/drain electrodes 45 are electrically conductive and may be composed of any suitable material or combination of materials. For example, each source/drain electrode 45 may comprise a layer of palladium (Pd) having a thickness of about 20 nm and a layer of gold (Au) having a thickness of about 40 nm. As another example, each source/drain electrode 45 may comprise a layer of titanium (Ti) having a thickness of about 20 nm and a layer of gold (Au) having a thickness of about 50 nm. The source/drain electrodes 45 may be formed using conventional semiconductor processing techniques, such as electron beam evaporation combined with a lift-off process. It is to be understood that other materials, thicknesses, and/or deposition processes may be used for the source/drain electrodes 45.

Figure 8:
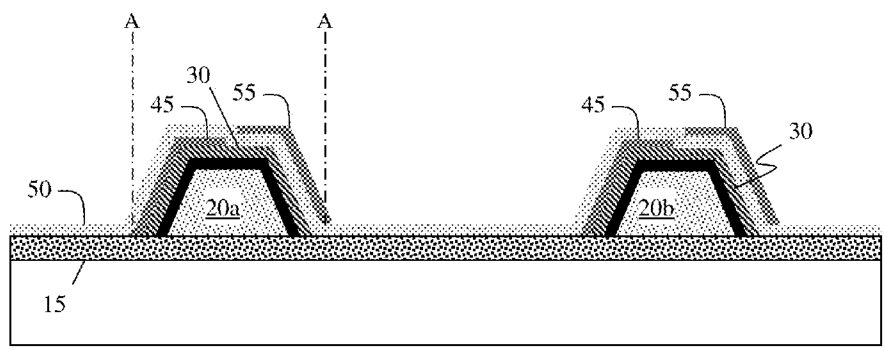

As shown in FIG. 8, a gate dielectric 50 is formed on exposed surfaces of the insulator layer 15, graphene 30, and source/drain electrodes 45. The gate dielectric 50 may comprise any suitable material including, but not limited to, $Al_2O_3$, $HfO_2$, SiN, polymer (e.g., NFC, ZEP520a, etc.), and combinations thereof. The gate dielectric 50 may be formed using conventional semiconductor processing techniques including, but not limited to, atomic layer deposition (ALD), e.g., for $Al_2O_3$ and/or $HfO_2$, plasma enhanced chemical vapor deposition (PECVD), e.g., for SiN, and spin-coating, e.g., for polymers. The gate dielectric 50 may have a physical thickness of about 10 nm to about 20 nm, although other thicknesses, materials, and/or formation processes may be used within the scope of the invention.

Still referring to FIG. 8, gate electrodes 55 are formed on the gate dielectric 50 on the mandrels 20*a* and 20*b*. The gate electrodes 55 are electrically conductive and may be composed of any suitable material or combination of materials. For example, each gate electrode 55 may comprise platinum (Pt), aluminum (Al), titanium (Ti), and/or gold (Au). The gate electrodes 55 may be formed using conventional semiconductor processing techniques, such as electron beam evaporation combined with a lift-off process. The gate electrodes 55 are not limited to the materials and processes described herein, and other materials and/or formation processes may be used within the scope of the invention.

Figure 9:
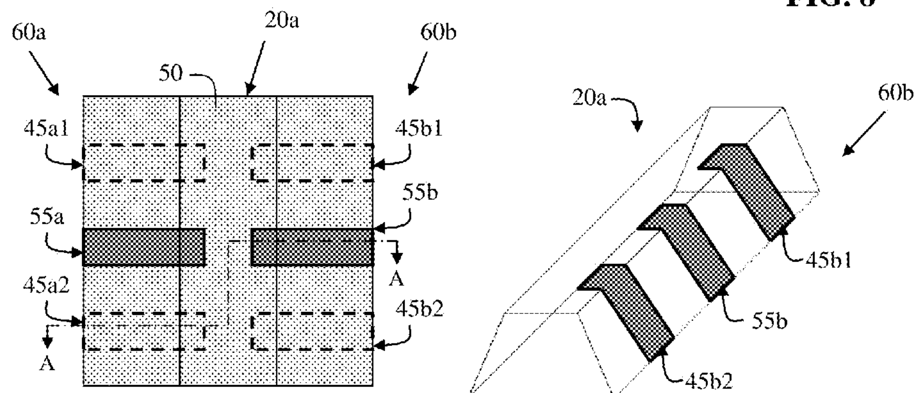

FIG. 9 shows a top (e.g., plan) view of the mandrel 20*a* at section A-A of FIG. 8. As depicted in FIGS. 8 and 9, the source/drain electrodes 45 are directly on the graphene 30 and covered with the gate dielectric 50, and the gate contacts 55 are directly on the gate dielectric 50. FIG. 9 shows a first FET 60*a* comprising source electrode 45*a*1, drain electrode 45*a*2, and gate electrode 55*a* on a first side of the mandrel 20*a*. On the other side of the same mandrel 20*a*, a second FET 60*b* comprises source electrode 45*b*1, drain electrode 45*b*2, and gate electrode 55*b*.

As depicted in FIGS. 8 and 9, the graphene 30 serves as a channel between the source electrode 45*a*1 and drain electrode 45*a*2, as well as between source electrode 45*b*1 and drain electrode 45*b*2. In this manner, first and second graphene FETs 60*a* and 60*b* are provided. Moreover, the FETs 60*a* and 60*b* are vertical transistors in the sense that the components (e.g., source, drain, channel, etc.) are built upward from the horizontal top plane of the substrate, rather than being horizontally planar on the top plane of the substrate. In this manner, more transistors may be provided in a given footprint on the substrate. Mandrel 20*b* may have a similar arrangement of vertical graphene FETs.

Figure 10:
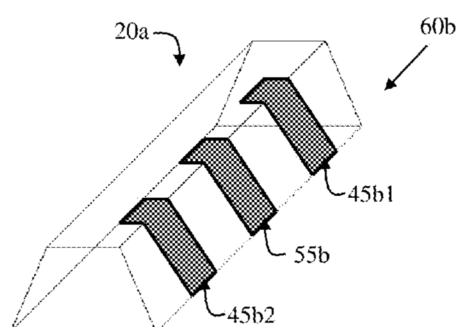

FIG. 10 shows a perspective diagrammatic view of the second FET 60*b* comprising source electrode 45*b*1, drain electrode 45*b*2, and gate electrode 55*b* arranged on the mandrel 20*a*. For clarity, the gate dielectric and graphene are not shown in FIG. 10.

Figure 11:
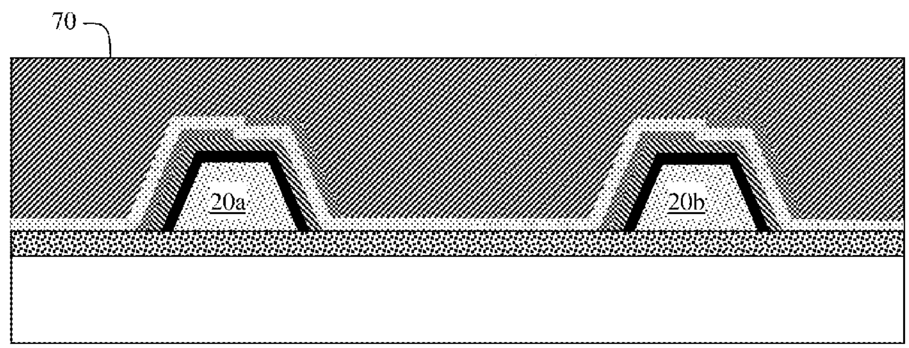

As shown in FIG. 11, an insulator layer 70 is formed over the entire structure. The insulator layer 70 may comprise any suitable electrical insulator material, such as, for example, borophosphosilicate glass (BPSG), tetraethylorthosilicate (TEOS), phosphosilicate glass (PSG), etc. The insulator layer 70 may be formed using conventional semiconductor manufacturing processes, such as CVD.

Figure 12:
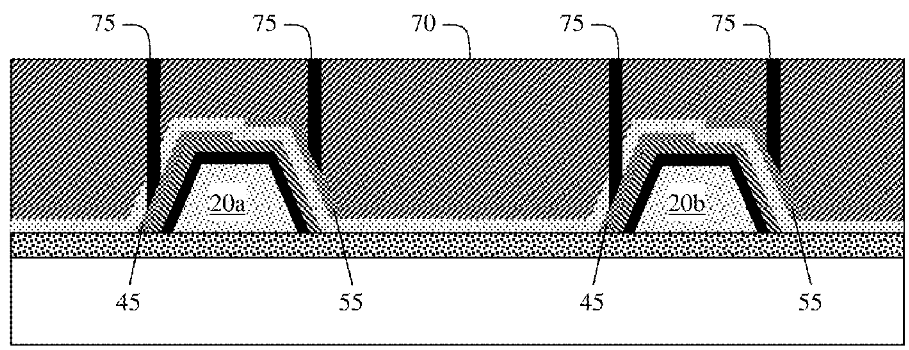

As shown in FIG. 12, electrical contacts 75 are formed in the insulator layer 70 and contacting the source/drain electrodes 45 and gate electrodes 55. The contacts 75 may be any suitable electrically conductive material including, but not limited to, tungsten (W). The contacts 75 may be formed using conventional processing techniques, such as masking the insulator layer 70, etching patterns in the insulator layer 70, filling the patterns with the electrically conductive material, and planarizing the top surface.

For example, as is understood by those of ordinary skill in the art, a photomask may provided by forming a layer of photoresist material on the insulator layer 70, exposing the photoresist material to a pattern of light, and developing the exposed photoresist material. An etching process, such as a reactive ion etch (RIE), may then be used to form patterns (e.g., openings) in the insulator layer 70 by removing portions of the insulator layer 70 that are not covered by the photomask. The etch process may also remove portions of the gate dielectric 50 for exposing the source/drain electrodes 45. After etching, the photomask may be removed using a conventional ashing or stripping process. A deposition process, such as chemical vapor deposition (CVD) or atomic layer deposition (ALD), may then be used to fill the patterns (openings) with electrically conductive material including, e.g., tungsten (W). A liner material, such as Ti, TiN, etc., may be formed as a thin film on the walls of the patterns (openings) prior to filling the patterns (openings) with the conductive material. A planarization process, such as chemical mechanical polish (CMP), may be used to remove material from the top surface of the structure to form a substantially planar uppermost surface.

Figure 13:
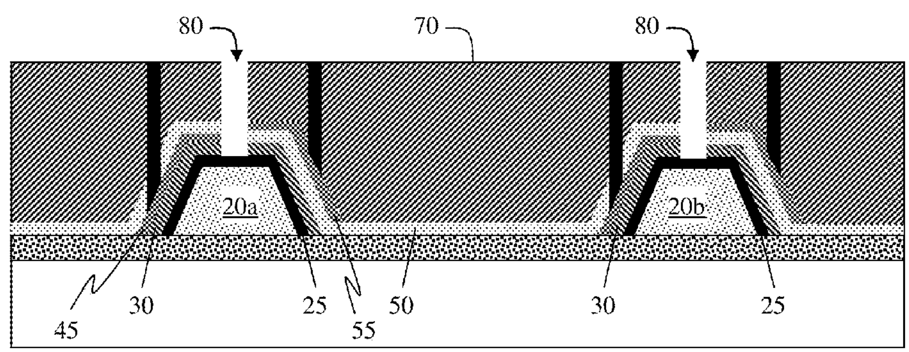

As shown in FIG. 13, vent holes 80 are formed through the insulator layer 70, gate dielectric 50, and graphene 30 to expose a portion of the sacrificial seed material 25. The vent holes 80 may be formed using conventional lithographic masking and etching processes. In embodiments, each vent hole 80 extends completely through a depth of the graphene 30 as well as along an entire length of the graphene 30 across the upper (e.g., horizontal) surface of the mandrel, such that the graphene 30 on each mandrel is divided (e.g., bisected) into discrete sections, e.g., one discrete section for each respective FET (e.g., FETs 60*a* and 60*b* shown in FIG. 9) on each mandrel. For example, each vent hole 80 may comprise a rectangular slot that extends across the entire top surface of the mandrel. By forming the vent hole 80 through the entire length and depth of the graphene along the top of the mandrel, the two FETs on either side of the mandrel are electrically isolated from one another. In additional embodiments, the vent hole 80 abuts against or extends into the source/drain electrodes 45 and gate electrodes 55. In this manner, in each FET (e.g., FET 60*a* and 60*b* shown in FIG. 9), an electrical path through the graphene from the source electrode to the drain electrode necessarily passes under the gate electrode.

Figure 14:
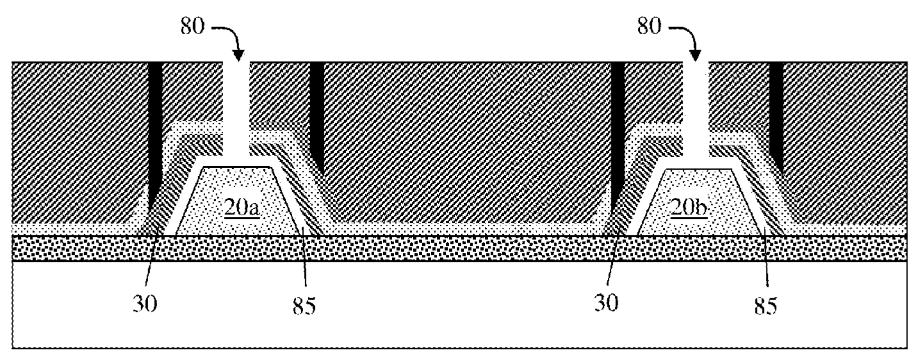

FIG. 14 shows the removal of the sacrificial seed material 25. In embodiments, the sacrificial seed material 25 is etched through the vent hole 80 using any suitable etch process. For example, when the sacrificial seed material 25 comprises Ni, a hydrochloric acid (HCl) wet etch may be performed through the vent hole 80 to selectively remove the Ni without removing the graphene 30. In this manner, an air gap 85 is formed between the graphene 30 and the mandrel 20*a*/20*b*.

Figure 15:
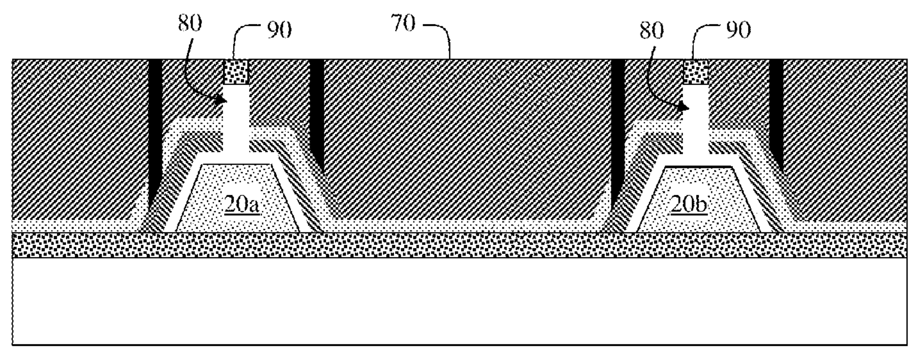

As shown in FIG. 15, the vent holes 80 are plugged with an insulator material 90. In embodiments, a layer of the insulator material 90 is formed on the insulator layer 70 and in the vent holes 80. The layer of the insulator material 90 may be formed using conventional processes, such as CVD. The insulator material 90 is then removed from the top surface of the insulator layer 70, e.g., by CMP or an etch-back process, leaving the insulator material 90 in the vent holes 80. The insulator material 90 may comprise any suitable material, and in embodiments is the same as insulator layer 15, e.g., SiN.

Figure 16:
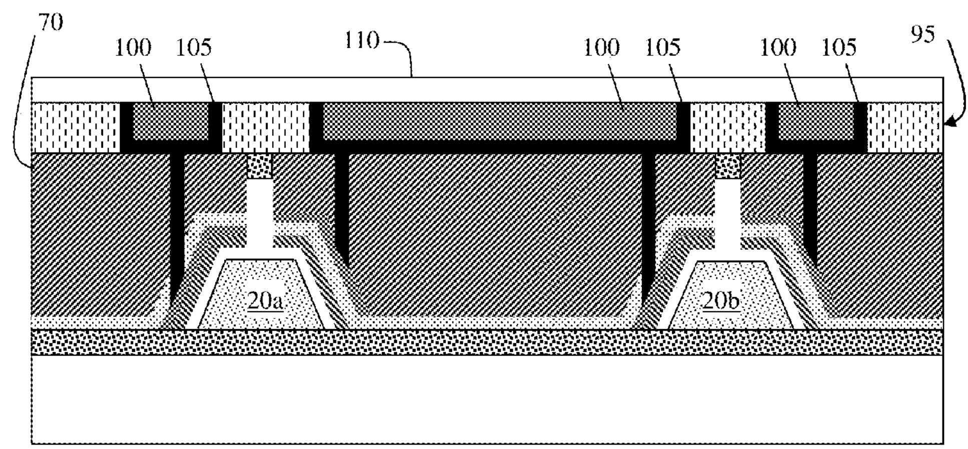

FIG. 16 shows additional processing of the semiconductor structure, including forming a wiring layer 95, one or more wires/interconnects 100 with optional liner 105, and a barrier layer 110, all of which may be formed using conventional materials and semiconductor manufacturing processes. For example, the wiring layer 95 may comprise any suitable insulator material, such as SiCOH formed by CVD on the insulator layer 70. Trenches may be formed in the wiring layer 95 by lithographic patterning and etching processes. Liner 105 may comprise any suitable barrier material, such as TaN/Ta formed by CVD in the trenches. Wires/interconnects 100 may comprise any suitable conductive material, such as Cu, Al, etc., formed by CVD on the liner 105 in the trenches. Barrier layer 110 may comprise any suitable barrier material, such as SiCN formed by CVD over the entire structure. One or more polish steps, e.g., CMP, may be employed during the fabrication of the wiring layer 95, wires/interconnects 100, liner 105, and barrier layer 110.

Figure 17:
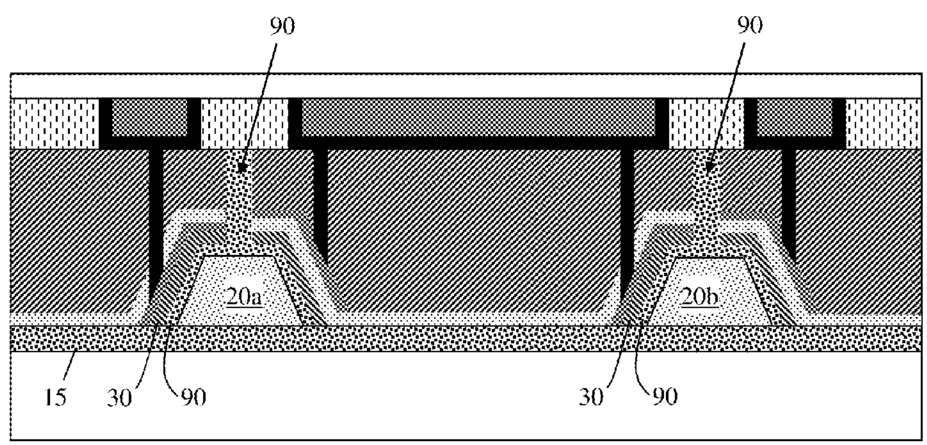

FIG. 17 shows a structure similar to that of FIG. 16 but with an optional filling of the air gap between the graphene 30 and the mandrels 20*a* and 20*b*. Referring back to FIGS. 14 and 15, instead of plugging only a top portion of the vent holes, e.g., as shown at FIG. 15, the insulator material 90 may be formed in substantially the entire air gap 85 between the graphene 30 and the mandrels 20*a* and 20*b*. Forming the insulator material 90 below the graphene 30 provides structural support and electrical isolation.

Figure 18:
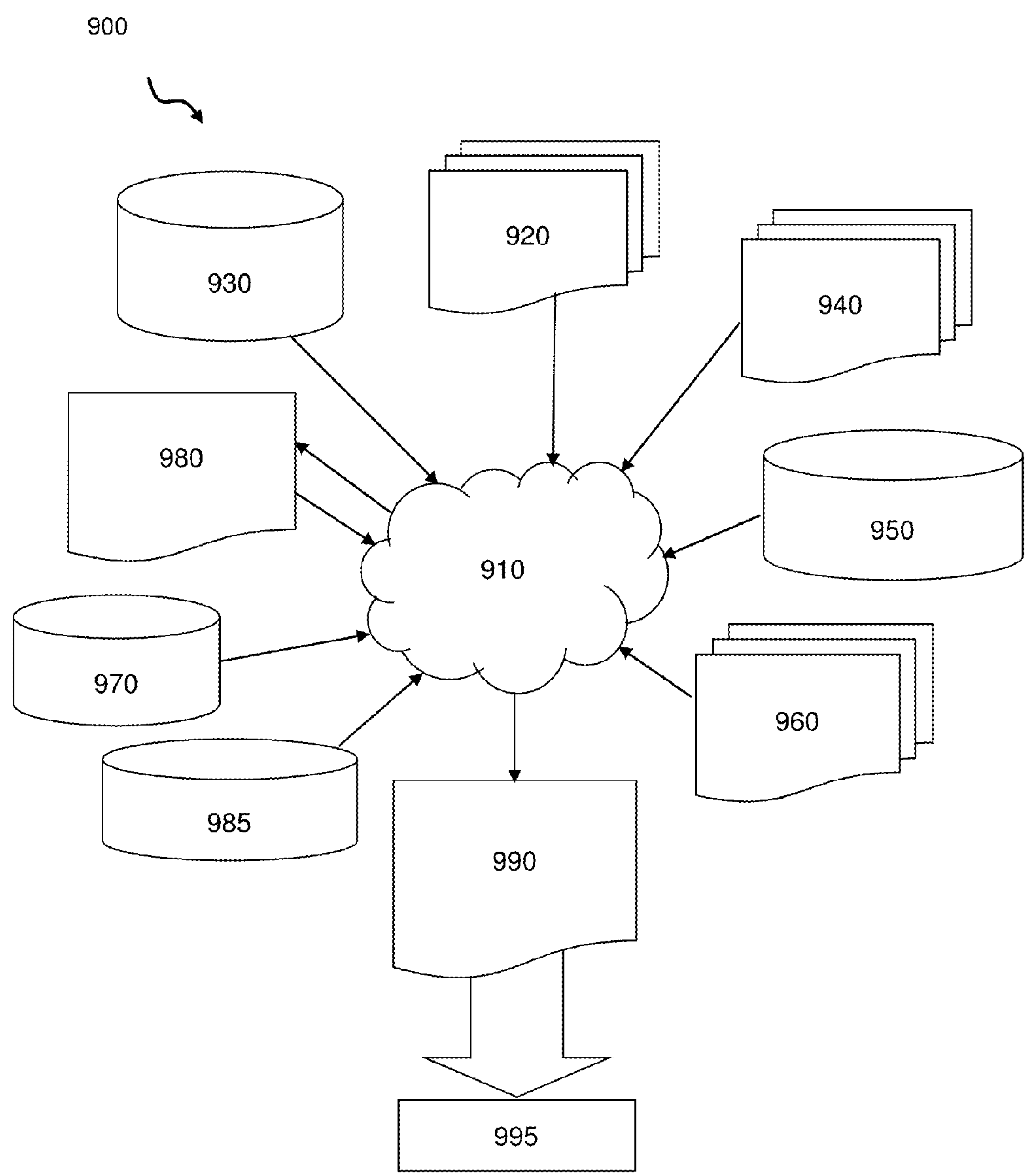
FIG. 18 is a flow diagram of a design process used in semiconductor design, manufacture, and/or test.

FIG. 18 is a flow diagram of a design process used in semiconductor design, manufacture, and/or test. FIG. 18 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-17. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 18 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-17. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-17 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-17. In one embodiment, design structure 990 may comprise a compiled, executable HDL simulation model that functionally simulates the devices shown in FIGS. 1-17.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-17. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The corresponding structures, materials, acts, and equivalents of all means or step plus function elements in the claims, if applicable, are intended to include any structure, material, or act for performing the function in combination with other claimed elements as specifically claimed. Moreover, while the invention has been described in terms of embodiments, those of ordinary skill in the art will recognize that the invention can be practiced with modifications and in the spirit and scope of the appended claims.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method of manufacturing a semiconductor structure, comprising:

forming a mandrel comprising an insulator material on an insulator layer on a substrate, wherein the insulator material has angled sidewalls and a top surface;

forming a seed material on the sidewalls and the top surface of the insulator material;

forming a graphene field effect transistor (FET) on the seed material; and removing the seed material;

forming an upper insulator layer over the graphene FET;

wherein the removing the seed material comprises forming a vent hole in the upper insulator layer;

the vent hole extends completely through a depth of graphene; and the vent hole extends along an entire length of the graphene across an upper surface of the mandrel, such that the graphene on the mandrel is bisected into discrete sections.

2. The method of claim 1, wherein the forming the graphene FET comprises forming a graphene layer on the seed material.

3. The method of claim 2, wherein the forming the graphene FET comprises forming a source electrode and a drain electrode on the graphene layer.

4. The method of claim 3, wherein the forming the graphene FET comprises forming a gate dielectric on the source electrode, the drain electrode, and the graphene layer.

5. The method of claim 4, wherein the forming the graphene FET comprises forming a gate electrode on the gate dielectric.

6. The method of claim 2, wherein the seed material comprises nickel and the forming the graphene layer comprises a chemical vapor deposition on the nickel.

7. The method of claim 2, further comprising doping the graphene layer with one n-type and p-type doping.

8. The method of claim 1, wherein the removing the seed material comprises etching the seed material through the vent hole.

9. The method of claim 1, further comprising plugging the vent hole.

10. The method of claim 1, wherein the removing the seed material forms an air gap between a graphene layer of the graphene FET and the mandrel.

11. The method of claim 10, further comprising plugging the vent hole and filling the air gap with an insulator material.

12. The method of claim 1, further comprising forming the mandrel with a substantially trapezoidal cross-sectional shape having the sidewall and another sidewall.

13. The method of claim 12, further comprising:

forming the seed material on the other sidewall; and forming a second graphene FET on the other sidewall.

14. A method of manufacturing a semiconductor structure, comprising:

forming a mandrel on a semiconductor substrate;

forming a sacrificial seed material on first and second sidewalls of the mandrel;

forming a graphene layer on the sacrificial seed material on the first and second sidewalls of the mandrel;

forming source electrodes and drain electrodes on the graphene layer;

forming a gate dielectric on the source electrodes, the drain electrodes, and the graphene layer;

forming gate electrodes on the gate dielectric;

forming an insulator layer over the source electrodes, drain electrodes, and gate electrodes;

forming a vent hole in the insulator layer, the gate electrode, and the graphene; and removing the sacrificial seed material through the vent hole.

15. The method of claim 14, wherein the mandrel is composed of an insulator material.

16. The method of claim 14, wherein the vent hole extends completely through a depth of the graphene.

17. The method of claim 16, wherein the vent hole extends along an entire length of the graphene across an upper surface of the mandrel, such that the graphene on the mandrel is divided into discrete sections.

18. The method of claim 14, wherein the removing the sacrificial seed material through the vent hole forms a gap between the graphene and the mandrel, and further comprising filling the gap with an insulator material that is formed between the graphene and the mandrel.

19. The method of claim 14, wherein the graphene has a first portion arranged at a first angle relative to an upper surface of a substrate, a second portion arranged at a second angle relative to the upper surface of the substrate, and a third portion arranged between the first portion and the second portion, wherein the first angle is different than the second angle.

20. The method of claim 19, wherein at least one of the source electrodes is on the first portion of the graphene and the third portion of the graphene.

21. The method of claim 4, further comprising:

forming an upper insulator layer over the graphene FET;

forming an electrical contact contacting the source electrode by: masking the upper insulator layer; etching an opening through the upper insulator layer and the gate dielectric; and filling the opening with an electrically conductive material.

22. A method of manufacturing a semiconductor structure, comprising:

forming an insulator material on an insulator layer on a substrate, wherein the insulator material has angled sidewalls and a top surface;

forming a seed material on the sidewalls and the top surface of the insulator material;

forming a graphene field effect transistor (FET) on the seed material; and removing the seed material;

wherein the forminc the graphene FET comprises forming a graphene layer on the seed material;

the forming the graphene FET comprises forming a source electrode and a drain electrode on the graphene layer; and the source electrode and the drain electrode each are formed on and over an angled portion of the graphene layer and a top portion of the graphene layer that is at an angle relative to the angled portion of the graphene layer.

* * * * *